(12) United States Patent
Pook

(10) Patent No.: US 6,595,798 B1
(45) Date of Patent: Jul. 22, 2003

(54) TEST FIXTURE FOR TESTING A MULTI-PORT VOICE PROCESSING CARD AND THE LIKE

(75) Inventor: Gus Pook, Allendale, NJ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/280,171

(22) Filed: Mar. 29, 1999

(51) Int. Cl.[7] ............................................... H01R 13/60
(52) U.S. Cl. ..................... 439/540.1; 439/344; 439/372; 29/267; 29/764
(58) Field of Search ........................... 439/540.1, 344, 439/368, 372, 369, 352; 29/883, 750, 757, 758, 267, 278, 268, 739, 764

(56) References Cited

U.S. PATENT DOCUMENTS 6,123,564 A * 9/2000 Belmore, III ............... 439/344

\* cited by examiner

*Primary Examiner*—P. Austin Bradley
*Assistant Examiner*—Ross Gushi
(74) *Attorney, Agent, or Firm*—Blakely, Sokoloff, Taylor & Zafman LLP

(57) ABSTRACT

An improved test fixture for use preferably in inserting a plurality of RJ11 telephony connectors into a voice processing or similar circuit card is disclosed wherein a hinge like member is utilized in conjunction with a plate in order to simultaneously insert and remove plural RJ11 connectors from mating receptacles.

6 Claims, 3 Drawing Sheets

TEST FIXTURE FOR TESTING A MULTI-PORT VOICE PROCESSING CARD AND THE LIKE

TECHNICAL FIELD

This invention relates to a test fixture, and more particularly, to an improved apparatus that maximizes the efficiency of and decreases the time required to insert plural RJ11 jacks into a circuit card comprising a plurality of RJ11 receptors. This test fixture can be used to facilitate testing of telephony/voice processing cards.

BACKGROUND OF THE INVENTION

In the design of voice processing circuit cards, sometimes multiple RJ11 receptacles are included on a circuit card. Each such receptacle may process one incoming channel of audio from a telephone line. An example of such a multiple port voice processing card is the Dialogic D-41H, available from the assignee of the present invention.

In order to test that all of the functions properly work, an RJ11 connector must be connected sequentially, one by one, into each of the RJ11 receptacles. After the connector is installed in the receptacle, the particular test cycle on that channel is run, and the RJ11 connector is then installed into the next channel.

The repeated installation and removal of the RJ11 connectors is more cumbersome and time consuming than desirable. Additionally, the fact that plural channels are tested by sequentially connecting the RJ11 connectors subjects the system to error in that one or more channels may be inadvertently skipped by the operator doing the testing.

In view of the above, there exists a need in the art for an improved technique for inserting the RJ11 connector into each of the receptacles on a multi-channel board, and for testing the performance of the processing and other hardware and software associated with the channel.

SUMMARY OF THE INVENTION

The above and other problems of the prior art are overcome in accordance with the present invention which relates to a straightforward and easily manufactured test fixture which allows insertion of multiple RJ11 jacks into multiple ports in one step. The RJ11 connectors are aligned and fixed in place by a clamp, spaced apart within the clamp such that the spacing therebetween is equal to the space between the RJ11 receptacles on the circuit card to be tested. The test fixture also includes means for depressing the release buttons on the RJ11 connectors all simultaneously and in parallel, such that plural connectors may be inserted or removed in one step.

DETAILED DESCRIPTION OF THE PREFERRED EMBODIMENT

Figure 1:
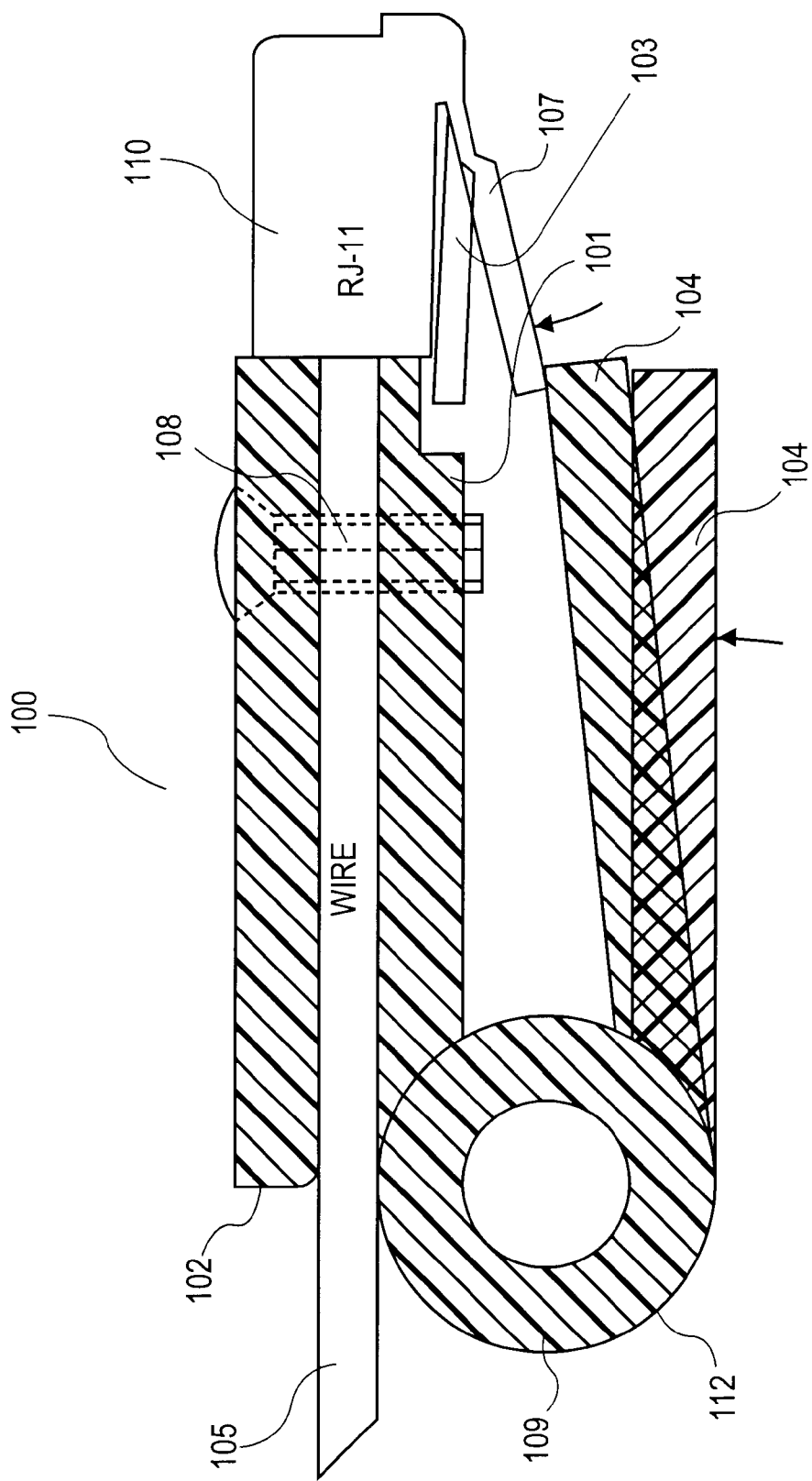
FIG. 1 shows a side view of an exemplary embodiment of the present invention.

FIG. 1 shows a side view of an exemplary embodiment of the present invention. The arrangement of FIG. 1 includes an exemplary RJ11 jack 110 which comprises a release button 107. The release button 107 is shown in two positions, one of which is when the button is depressed for release of the RJ11 jack and the other of which is when the release button 107 is not depressed and thus, holds the RJ11 jack in its associated receptacle.

The exemplary embodiment of FIG. 1 also comprises a hinge 112 which includes a depression plate 104, a base plate 101 and a pivotal point 109. The screw 108 clamps plate 102 against base plate 101, to thereby hold wire 105 between plate 102 and base plate 101. Depression plate 104 pivots toward base plate 101 in order to depress depression button 107 and thereby release the RJ11 jack or allow for installation in the receptacle.

Figure 2:
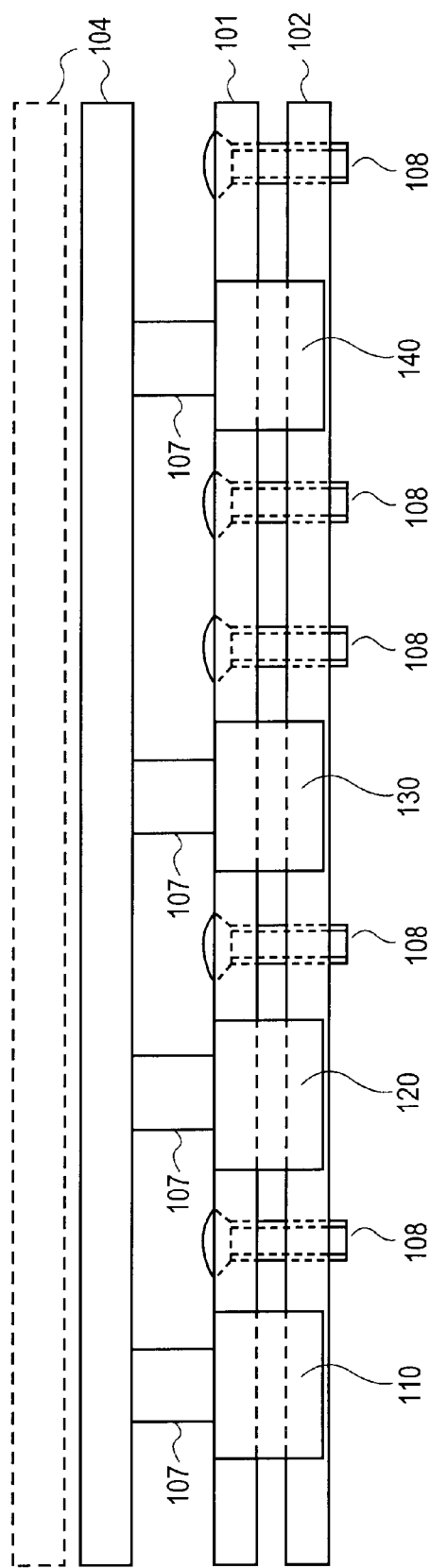
FIG. 2 shows a front view of the exemplary embodiment of FIG. 1.

FIG. 2 shows a front view of the arrangement of FIG. 1. In FIG. 2, an exemplary plurality of four RJ11 connectors 110, 120, 130 and 140 are installed between base plate 101 and plate 102 through the use of screws 108. The screws 108 penetrate through the base plate 101 and plate 102 in order to clamp down on the wires 105 which are each separately connected to a separate and corresponding RJ11 connector. Accordingly, the RJ11 connectors are prevented from moving laterally in FIG. 2. Optionally, small grooves may be machined into plate 102 and/or base plate 101 so that the wire 105 is fittingly disposed within the groove in order to further prevent lateral movement of wire 105 and thus, the corresponding RJ11 connector.

Figure 3:
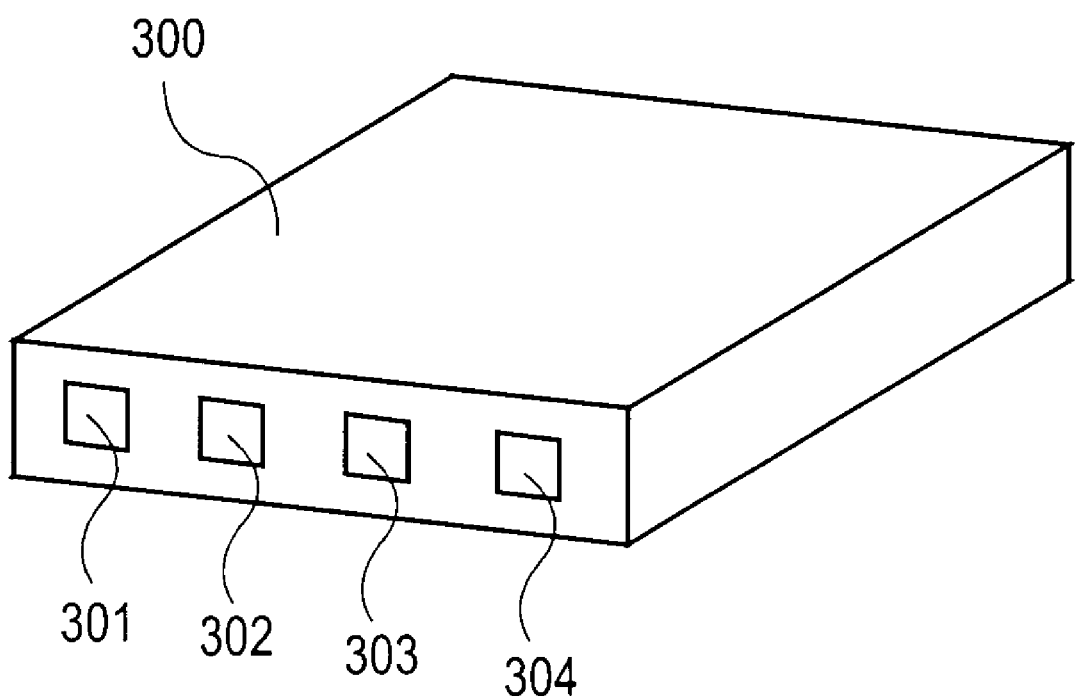
FIG. 3 shows an exemplary circuit card with a plurality of four RJ11 receptacles thereon.

The spacing between RJ11 connectors 110, 120, 130 and 140 is arranged such that it corresponds to the spacing between the RJ11 receptacles 301 through 304 shown in FIG. 3 on an exemplary voice processing circuit card 301.

In operation, the test fixture 100 of the present invention is utilized by aligning the four RJ11 connectors 110, 120, 130 and 140 with the four receptacles 301–304. The entire test fixture 100 is then pushed toward the circuit card 300 and all four RJ11 connectors are simultaneously inserted into the receptacles. When it is desired to remove the receptacles from the circuit card, depression plate 104 is pressed toward plate 101, thereby causing the depression button 107 on each of RJ11 connectors 110, 120, 130, and 140 to be released.

The test fixture may be manufactured with any number of RJ11 connectors installed therein, and may constructed of a variety of different materials. A preferred embodiment utilizes a standard hinge to form plate 101 and base plate 101 and depression plate 104. An additional metal plate is attached to baseplate 101 of the hinge with one or more screws.

The above describes the preferred embodiment of the invention. Various other modifications and additions to the invention will be apparent to those of ordinary skill in the art. Such modifications are intended to be covered by the following claims.

What is claimed is:

1. Apparatus for inserting multiple RJ11 connectors into a mating receptacle comprising:

a base plate;

a plate connected to said base plate in a fixed manner;

a plurality of wires compressed between the plate and the base plate substantially in parallel;

a depression plate rotatably attached to the plate.

2. Apparatus of claim 1 wherein said base plate and said depression plate are formed from a hinge.

3. Apparatus of claim 1 wherein said wires are fittingly installed in grooves formed in said base plate or said plate.

4. A method of connecting plural RJ11 connectors to plural RJ11 receptacles comprising the steps of:

rotatably mounting a depression plate adjacent a plurality of depression buttons of said plural RJ11 connectors;

utilizing said depression plate to substantially simultaneously depress said plurality of depression buttons of said plural RJ11 connectors; and inserting said RJ11 connectors into said RJ11 receptacles.

5. The method of claim 4 further comprising connecting said RJ11 connectors to a standard telephone wire, and compressing said telephone wires between said base plate and an additional plate.

6. The method of claim 5 further comprising connecting said additional plate to said base plate with a plurality of screws.

* * * * *